United States Patent [19]

Ikuzawa

[11] Patent Number: 5,517,156
[45] Date of Patent: May 14, 1996

[54] DIGITAL PHASE SHIFTER

[75] Inventor: Kenzo Ikuzawa, Kanagawa, Japan

[73] Assignee: Leader Electronics Corp., Kanagawa, Japan

[21] Appl. No.: 319,975

[22] Filed: Oct. 7, 1994

[51] Int. Cl.$^6$ .............................. H03L 7/00; H03L 7/193
[52] U.S. Cl. ............................ 331/16; 327/106; 327/237; 332/103; 332/144
[58] Field of Search .................... 331/1 A, 16, 18, 331/25; 332/103, 104, 144; 327/106, 237, 244, 276; 375/308

[56] References Cited

U.S. PATENT DOCUMENTS

| | | | |
|---|---|---|---|
| 4,134,072 | 1/1979 | Bolger | 327/106 |
| 4,484,296 | 11/1984 | Treise et al. | 327/106 X |
| 4,511,862 | 4/1985 | Motiwala et al. | 332/103 |
| 4,617,535 | 10/1986 | Unerdem | 332/104 |
| 4,677,395 | 6/1987 | Baker | 331/25 |
| 4,873,500 | 10/1989 | Genrich | 332/104 |
| 4,897,620 | 1/1990 | Paradise | 332/103 X |
| 4,951,004 | 8/1990 | Sheffer et al. | 331/1 A |
| 4,965,533 | 10/1990 | Gilmore | 331/18 |
| 5,126,960 | 6/1992 | Thong | 364/721 |
| 5,146,186 | 9/1992 | Vella | 331/16 |

FOREIGN PATENT DOCUMENTS

| | | |
|---|---|---|
| 62-207012 | 9/1987 | Japan . |
| 4-229703 | 8/1992 | Japan . |

*Primary Examiner*—David Mis
*Attorney, Agent, or Firm*—Fish & Richardson

[57] ABSTRACT

A digital phase shifter is provided which uses a direct digital synthesizer. The digital phase shifter is provided with a digital phase-shifted waveform signal generator in which a plurality of digital phase-shifted waveform signals having different phase shifts are stored. The generator outputs a digital phase-shifted waveform signal corresponding to a specified phase shift from a phase shift specifying section in synchronism with an oscillation signal from a PLL circuit. The output is converted to an analog form by a D/A convertor to generate a phase-shifted waveform.

15 Claims, 8 Drawing Sheets

RELATIONSHIP BETWEEN ANGLE OF SINUSOIDAL WAVE AND SAMPLE VALUE (DATA WORD)

Fig. 8(A)

BEFORE BIT MANIPULATIONS

| PHASE SHIFT ANGLE | DATA WORD SDW1 | DATA WORD SDW2 | DATA WORD SDW3 | DATA WORD SDW4 |
|---|---|---|---|---|
| -29.3° | 28AH | 3ECH | 176H | 14H |
| -29.4° | 289H | 3ECH | 177H | 14H |
| -29.5° | 289H | 3ECH | 177H | 14H |
| -29.6° | 288H | 3EDH | 178H | 13H |
| -70.1° | 127H | 3CFH | 2D9H | 31H |
| -70.2° | 126H | 3CEH | 2DAH | 32H |
| -70.3° | 126H | 3CEH | 2DAH | 32H |
| -70.4° | 125H | 3CEH | 2DBH | 32H |

Fig. 8(B)

AFTER BIT MANIPULATIONS

| PHASE SHIFT ANGLE | DATA WORD SDW1 | DATA WORD SDW2 | DATA WORD SDW3 | DATA WORD SDW4 |
|---|---|---|---|---|
| -29.4° | 28<u>A</u>H | 3ECH | 177H | 14H |
| -70.2° | 126H | 3CEH | 2D<u>9</u>H | 32H |

DIGITAL PHASE SHIFTER

BACKGROUND OF THE INVENTION

1. Field of the Invention

The present invention relates to a digital phase shifter for shifting in phase an input wave having a predetermined waveform such as a sinusoidal continuous wave, for example.

2. Prior Art

As a means of providing a continuous wave having a predetermined phase shift, digital phase shifters have conventionally been used. For example, in a vector scope which displays relative amplitudes and phases of a plurality of chrominance components in a composite video signal, a digital phase shifter has been used to shift in phase a subcarrier received as an input by a predetermined amount. One such digital phase shifter is disclosed in Japanese Patent Appln. Public-Disclosure No. 62-207012 (A Digital Phase Shifter), which has a structure utilizing the frequency heterodyne effect.

Also, Japanese Patent Appln. Public-Disclosure No. 4-229703 (A method of Generating Phase Correlated Waveforms) discloses a method of generating waveforms by a direct digital synthesizer (DDS) having a waveform look-up table.

Since the above-mentioned digital phase shifter of Public-Disclosure No. 62-207012 utilizes the frequency heterodyne effect, its circuit configuration is complicated.

SUMMARY OF THE INVENTION

It is therefore an object of the present invention to provide a phase shifting method and a digital phase shifter for shifting in phase an input waveform using DDS techniques.

It is another object of the present invention to provide a phase shifting method and a digital phase shifter which are capable of improving phase resolution using a digital-to-analog (D/A) convertor having a fixed resolution.

To achieve the above objects, according to the present invention, a phase shifting method for generating a phase-shifted waveform shifted in phase by a specified phase shift from an input waveform having a predetermined frequency, comprises the steps of: (a) receiving said input waveform in an analog form and generating an oscillation signal being phase-locked to said input waveform and having a frequency N times said predetermined frequency, where N is an integer equal to or larger than two; (b) generating a phase shift specifying signal representing a specified phase shift; (c) generating a digital phase-shifted waveform signal having said specified phase shift from a plurality of predetermined digital phase-shifted waveform signals having different phase shifts; and (d) converting said generated digital phase-shifted waveform signal to an analog form in synchronism with said oscillation signal to generate said phase-shifted waveform.

Also, according to the present invention, a digital phase shifter for generating a phase-shifted waveform shifted in phase by a specified phase shift from an input waveform having a predetermined frequency, comprises: (a) a PLL circuit including an input terminal for receiving said input waveform in an analog form and a voltage controlled oscillator for generating an oscillation signal, said oscillation signal being phase-locked to said input waveform and having a frequency N times said predetermined frequency, where N is an integer equal to or larger than two; (b) phase shift specifying means for generating a phase shift specifying signal representing a specified phase shift; (c) digital phase-shifted waveform signal generator means connected to receive said oscillation signal and said phase shift specifying signal and having a plurality of digital phase-shifted waveform signals stored therein, said plurality of digital phase-shifted waveform signals having different phase shifts, said generator means being operative to generate a digital phase-shifted waveform signal having said specified phase shift from said plurality of stored digital phase-shifted waveform signals; and (d) convertor means connected to receive said generated digital phase-shifted waveform signal for converting said generated digital phase-shifted waveform signal to an analog form to generate said phase-shifted waveform.

According to the present invention, each of the plurality of digital phase-shifted waveform signals is constituted of an N number of waveform data words. Also, the plurality of stored digital phase-shifted waveform signals may be signals corresponding to a partial range within the entire range of phase shifts. Further, the digital phase-shifted waveform signal generator means may comprise: (a) storage means for storing a plurality of digital phase-shifted waveform signals in a phase shift range from zero to 1/N of said entire range of phase shifts, each stored digital phase-shifted waveform signal including a period portion of a waveform being constituted of an N number of waveform data words, said N number of waveform data words including from a first waveform data word associated with a first 1/N period portion to a Nth waveform data word associated with an Nth 1/N period portion; (b) determining means for determining which of an N number of 1/N ranges within said entire range of phase shifts from a range 0–1/N to a range (N−1)/N—N/N, said specified phase shift falls under; (c) an N number of register means including first to Nth registers for holding an N number of 1/N period portions of generated phase-shifted waveform data words from a first 1/N period portion to a Nth 1/N period portion; (d) writing means for distributively writing said first to Nth waveform data words of one stored digital phase-shifted waveform signal within said plurality of stored digital phase-shifted waveform signals into said first to Nth registers in accordance with one of different distributing ways depending on a determination result of said determining means, so as to constitute a digital phase-shifted waveform signal having said specified phase shift by the waveform data words held in said first to Nth registers; and (e) reading means connected to receive said oscillation signal for reading and outputting the contents of said first to Nth registers during the first to Nth 1/N period portions, respectively, of said input waveform.

Further, according to the present invention, the convertor means may comprise a D/A convertor for converting a digital signal having a predetermined number of bits to an analog signal; and (b) each said waveform data word may include the predetermined number of bits. In this case, within the plurality of stored digital phase-shifted waveform signals, if the N number of waveform data words of respective stored digital phase-shifted waveform signals corresponding to adjacent phase shifts are identical to each other, at least one waveform data word in the N number of waveform data words of one of the stored digital phase-shifted waveform signals may be modified to make the plurality of stored digital phase-shifted waveform signals different from each other.

BRIEF DESCRIPTION OF THE DRAWINGS

FIGS. 8(A) and 8(B) are diagrams showing waveform data words constituting digital phase-shifted waveform signals of FIG. 5 before and after bit manipulations performed on the data words.

DETAILED DESCRIPTION OF THE PREFERRED EMBODIMENTS

Figure 1:
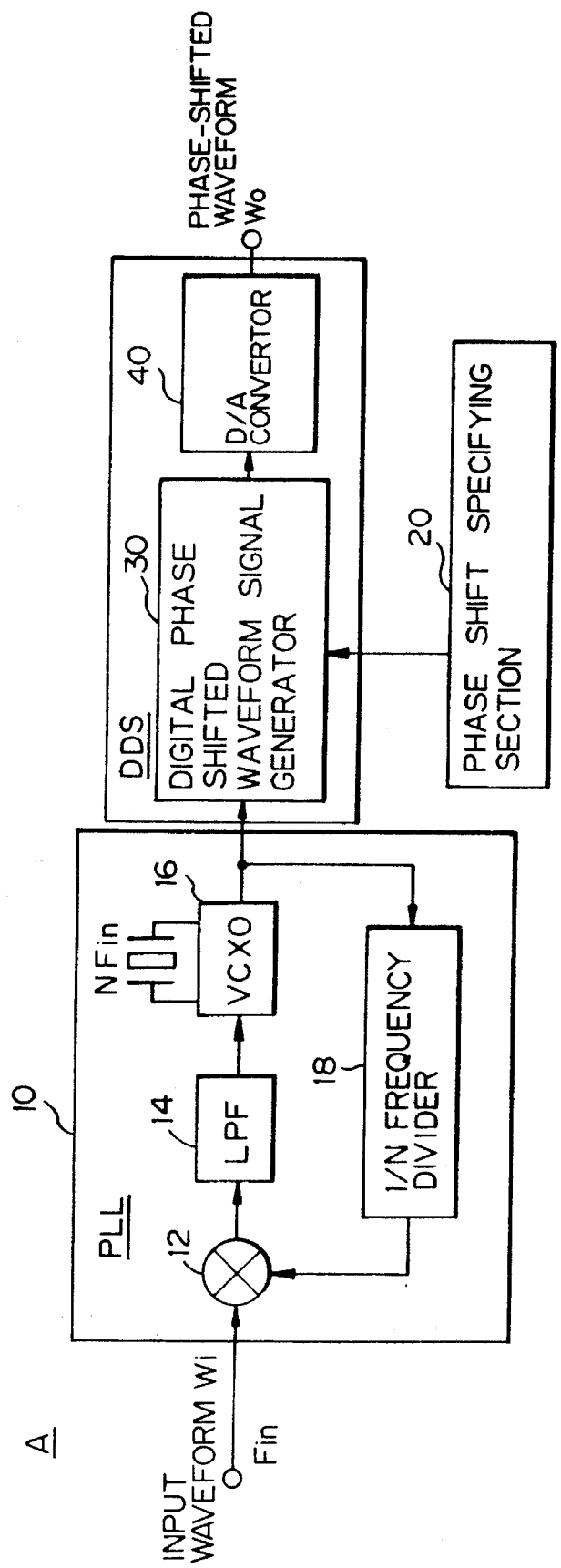
FIG. 1 is a block diagram showing the basic configuration of a digital phase shifter according to the present invention.

FIG. 1 shows the basic configuration of a digital phase shifter according to the present invention. The digital phase shifter A shifts in phase an input waveform $W_{in}$ approximately having a frequency $F_{in}$ by a desired amount to generate a resultant phase-shifted waveform $W_o$. The phase shifter A is generally composed of a PLL circuit 10; a phase shift specifying section 20; and a digital phase-shifted waveform signal generator 30 and a D/A convertor 40 which constitute a DDS (direct digital synthesizer) circuit. The PLL circuit 10, which is of a conventionally known circuit configuration, is composed of a phase comparator 12 which receives an input waveform $W_{in}$; a low pass filter (LPF) 14; a voltage controlled oscillator (VCXO) 16; and a frequency divider 18. It is assumed herein that a number of samples required per period for reproducing a continuous wave in accordance with the sampling theory is represented by N. In the present invention, since an N number of samples, which are two or more ($N \geq 2$), are used per period to synthesize an input waveform in the DDS circuit at a later stage in accordance with the sampling theory, a period must be divided into N portions which are two or more. For this reason, the VCXO 16 is provided with a quartz oscillator which oscillates at a frequency N times higher than $F_{in}$, and the frequency divider 18 divides the oscillation signal by N.

The digital phase-shifted waveform signal generator 30, which receives the oscillation signal having a frequency $NF_{in}$ from the VCXO 16, stores a predetermined number of digital phase-shifted waveform signals required to generate all digital phase-shifted waveform signals having different phase shifts within an entire range of phase shifts. Each of the stored digital phase-shifted waveform signals includes signals for a period of a phase-shifted waveform, and is constituted of N samples or data words per period, as mentioned above.

The phase shift specifying section 20 supplies the generator 30 with a signal which specifies a desired phase shift within the entire range of phase shifts. Then, the generator 30 generates a digital phase-shifted waveform signal which has the specified phase shift. More specifically, a sequence of N data words constituting the digital signal are orderly outputted in synchronism with the oscillation signal from the VCXO 16. When the outputting for a period has been completed, the N data words are again outputted from the first one of the data words. By repeating this, the digital phase-shifted waveform signal is successively outputted. The outputted signal is received by the D/A convertor which converts the received digital signal to an analog form to generate a phase-shifted waveform $W_o$ having the specified amount of phase shift.

Figure 2:
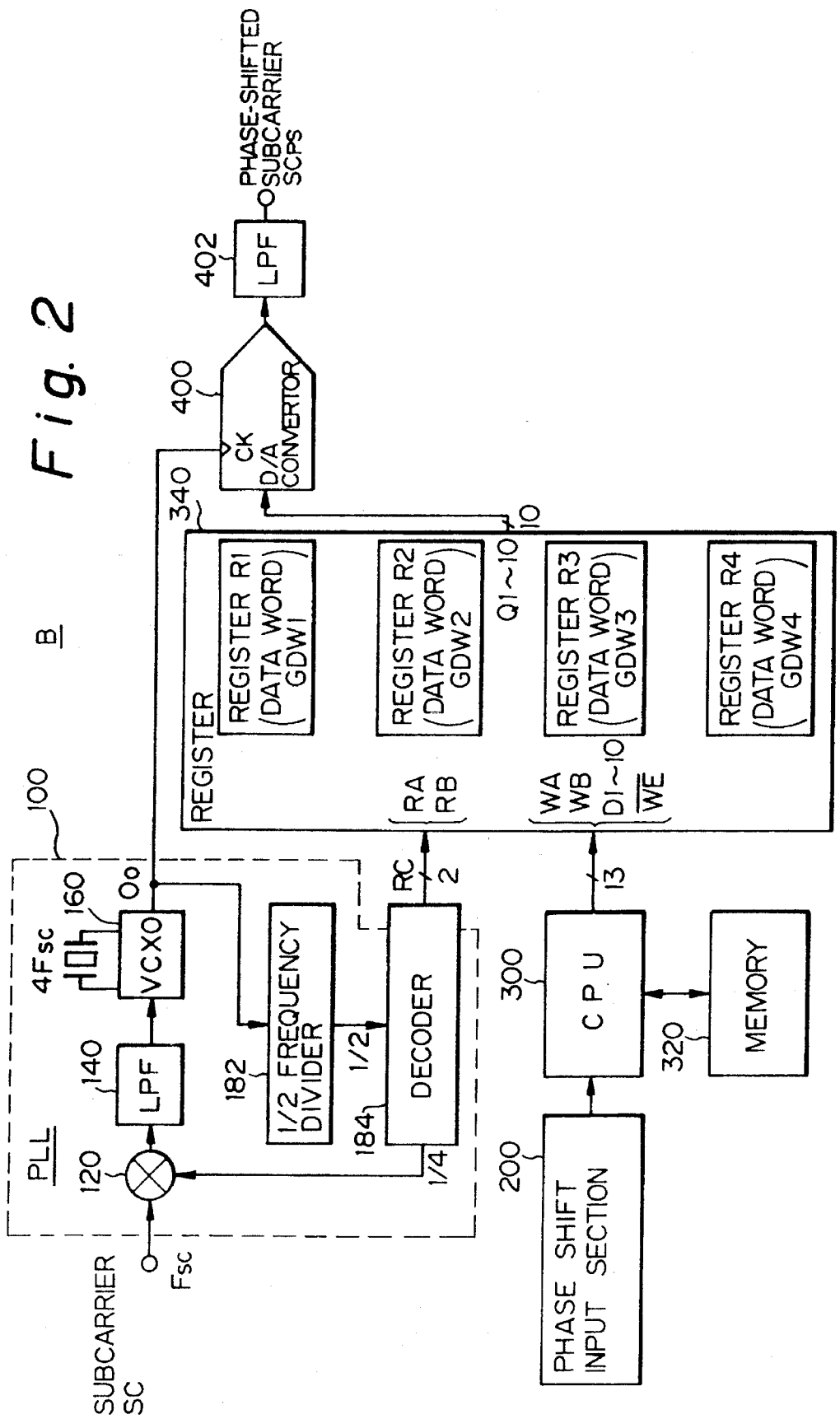
FIG. 2 is a block diagram showing a more specific embodiment of the digital phase shifter according to the present invention.

Next, FIG. 2 shows a digital phase shifter B which is a more specific embodiment of the basic configuration shown in FIG. 1. The digital phase shifter B is adapted for use in phase shifting a subcarrier SC of a television signal, wherein the number of samples or data words N per period is set to four (N=4). Also, in the digital phase shifter, the entire range of phase shifts is from zero to 360 degrees with the phase resolution of 0.1 degrees, and it has data for a quarter of the entire phase shift range, i.e., data for zero to 90 degrees as digital phase-shifted waveform signals. Further, each data word of a digital phase-shifted waveform signal is represented by ten bits.

Figure 3:
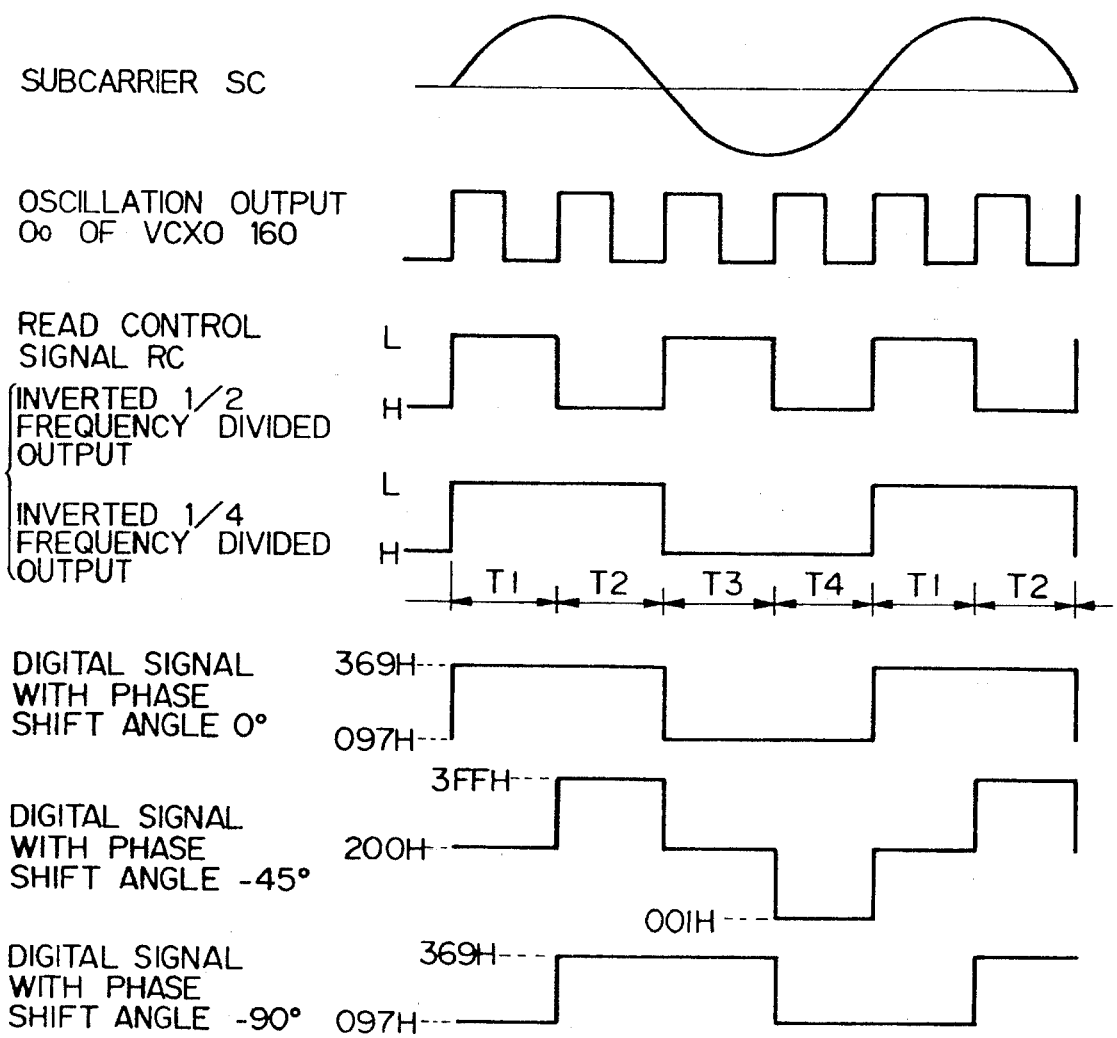
FIG. 3 is a timing chart relating to the operation of the digital phase shifter shown in FIG. 2.

Explaining in detail, the phase shifter B is composed of a PLL circuit 100 which receives the subcarrier SC having a frequency $F_{sc}$; a phase shift input section 200; and a DDS circuit constituted by a CPU 300, a memory 320, a register section 340 of latch type (including four registers R1–R4), a D/A convertor 400 of 10-bit accuracy, and a low pass filter 402 for outputting a phase-shifted subcarrier $SC_{ps}$. Since the phase shifter B has N set to four (N=4), the VCXO 160 has a quartz oscillator at a frequency $4 F_{sc}$ and outputs an oscillation signal $O_o$. As elements corresponding to the frequency divider 18 in FIG. 1, there are a ½ frequency divider 182 and a decoder 184 including a frequency divider for dividing a frequency by two. The decoder 184 applies a phase comparator 120 with a ¼ frequency divided output which is generated by further dividing the output of the frequency divider 182 by two, as well as supplies the register section 340 with an inverted version of the ½ frequency divided output of the frequency divider 182 and an inverted version of the ¼ frequency divided output as a read control signal RC. As shown in FIG. 3, when the inverted ¼ and ½ frequency divided outputs have the combination of "00", "01", "10", or "11", it represents a first quarter period interval T1, a second quarter period interval T2, a third quarter period interval T3, or a fourth quarter period interval T4 of the input subcarrier SC, respectively.

The register section 340 may be a four words×four bits register implemented by three IC devices of Type TC74H670 manufactured by Toshiba. Each of the registers R1–R4 can hold one word consisting of four bits. The registers R1–R4 are used to hold respective generated data words GDW1–GDW4 in a first, second, third and fourth quarter period portion of a phase-shifted waveform to be generated.

As illustrated, the register section 340 has address terminals WA and WB for specifying which of the four registers R1–R4 a data word is to be written into (note that the registers R1, R2, R3, and R4 have the addresses "00", "01", "10", and "11", respectively); data terminals D1–D10 for receiving a data word to be written; a write enable terminal WE⁻ terminal (the symbol "⁻" indicates an inversion of a logic signal represented by the preceding symbol. The same is applied to the following description); read address terminals RA and RB for specifying which of the registers R1–R4 a data word is to be read out from; and output terminals Q1–Q10 for outputting a data word read out. The read address terminals RA and RB receive the read control signal RC consisting of the inverted ¼ and ½ frequency divided outputs. A write into the register 340 will be described later.

Figure 4:
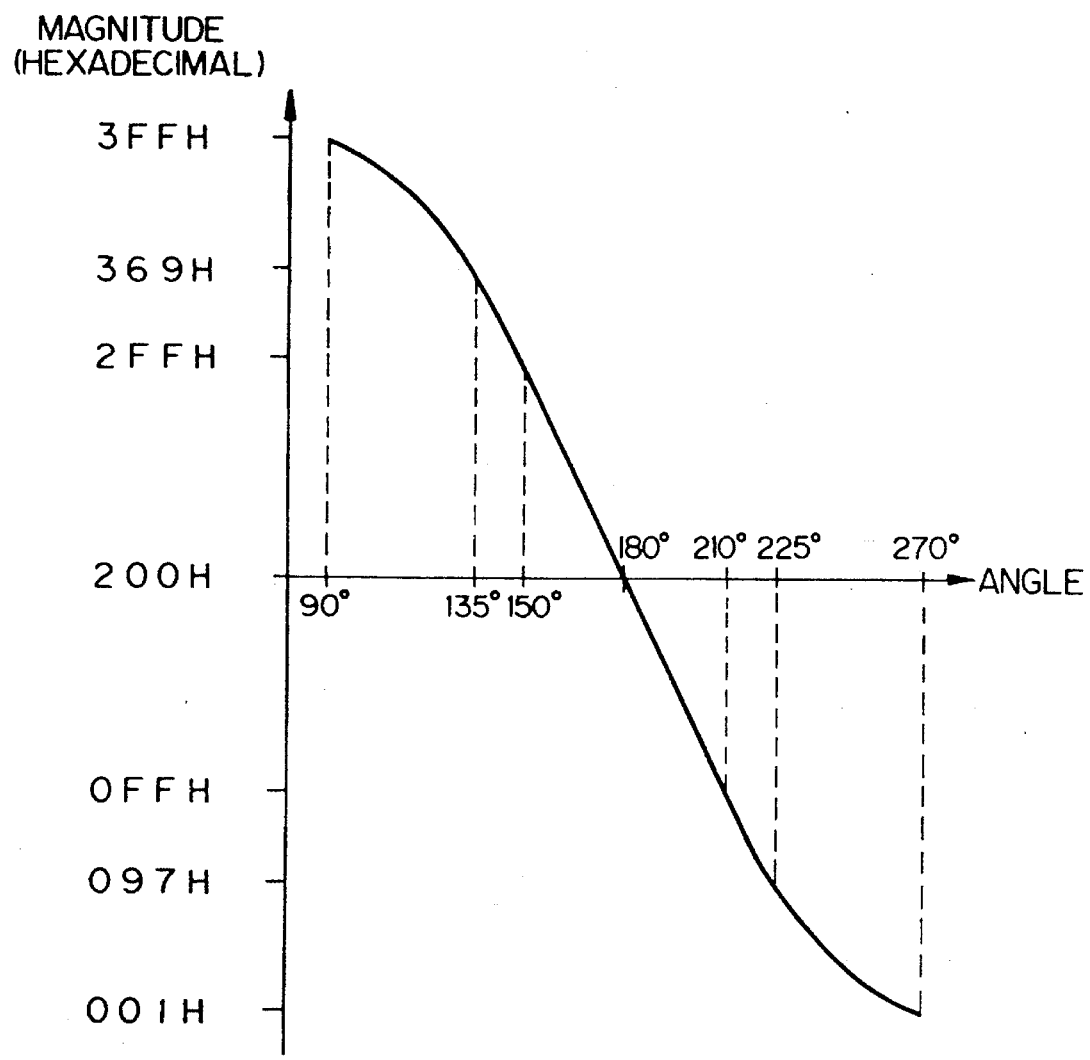
FIG. 4 is a diagram showing the relationship between the angle of a sinusoidal wave (with no phase shift) and the sample value (data word)

FIG. 4 shows sample values (in hexadecimal) at several points on a sinusoidal wave when it is represented by a 10-bit data word. As illustrated, the data word can take a minimum value equal to 001H to a maximum value equal to 3FFH. The middle value is 200H. Points at which a phase-shifted waveform of the sinusoidal wave is sampled are the center, i.e., at the position of 45 degrees in the first quarter period portion, and likewise, the central angular positions in the second, third, and fourth quarter period portions (i.e., 135, 225, and 315 degrees).

Next, the 10-bit accuracy D/A convertor 400, which receives data words GDW1–GDW4 from the register 340, receives the oscillation signal $O_o$ at a clock terminal (CK), and in synchronism with the signal $O_o$, converts the received data word to an analog signal and outputs it. The analog signal is received by a low pass filter 402 which smooths the analog signal to output a phase-shifted subcarrier $SC_{PS}$.

Assuming now that a phase shift of, for example, −45 degrees (see a digital signal with the phase shift angle of −45° in FIG. 3) has already been inputted, and that respective data words of a digital phase-shifted waveform signal corresponding to the phase shift have been held in the register 340 (i.e., GDW1=200H, GDW2=3FFH, GDW3=200H, GDW4=001H), the digital phase shifter B operates in the following manner. Specifically, as shown in the timing chart in FIG. 3, the oscillation signal $O_o$ and the read control signal RC are generated in synchronism with the inputted subcarrier SC. The read control signal RC addresses the register R1 during the interval T1 to read out its contents 200H. Then, conversion by the D/A convertor and smoothing by the filter are carried out. Likewise, the contents of the register R2, i.e. 3FFH are read out during the interval T2; the contents of the register R3, i.e., 200H during the interval T3; and the contents of the register R4, i.e., 001H during the interval T4. These are then converted and smoothed in the same manner. Thus, a smoothed version of a step-like waveform shown as the −45° digital phase-shifted signal in FIG. 3 is outputted. When the read-out has been completed for a period portion, the contents of the registers R1–R4 are cyclically and repeatedly read out to continuously generate the phase-shifted subcarrier.

Figure 5:
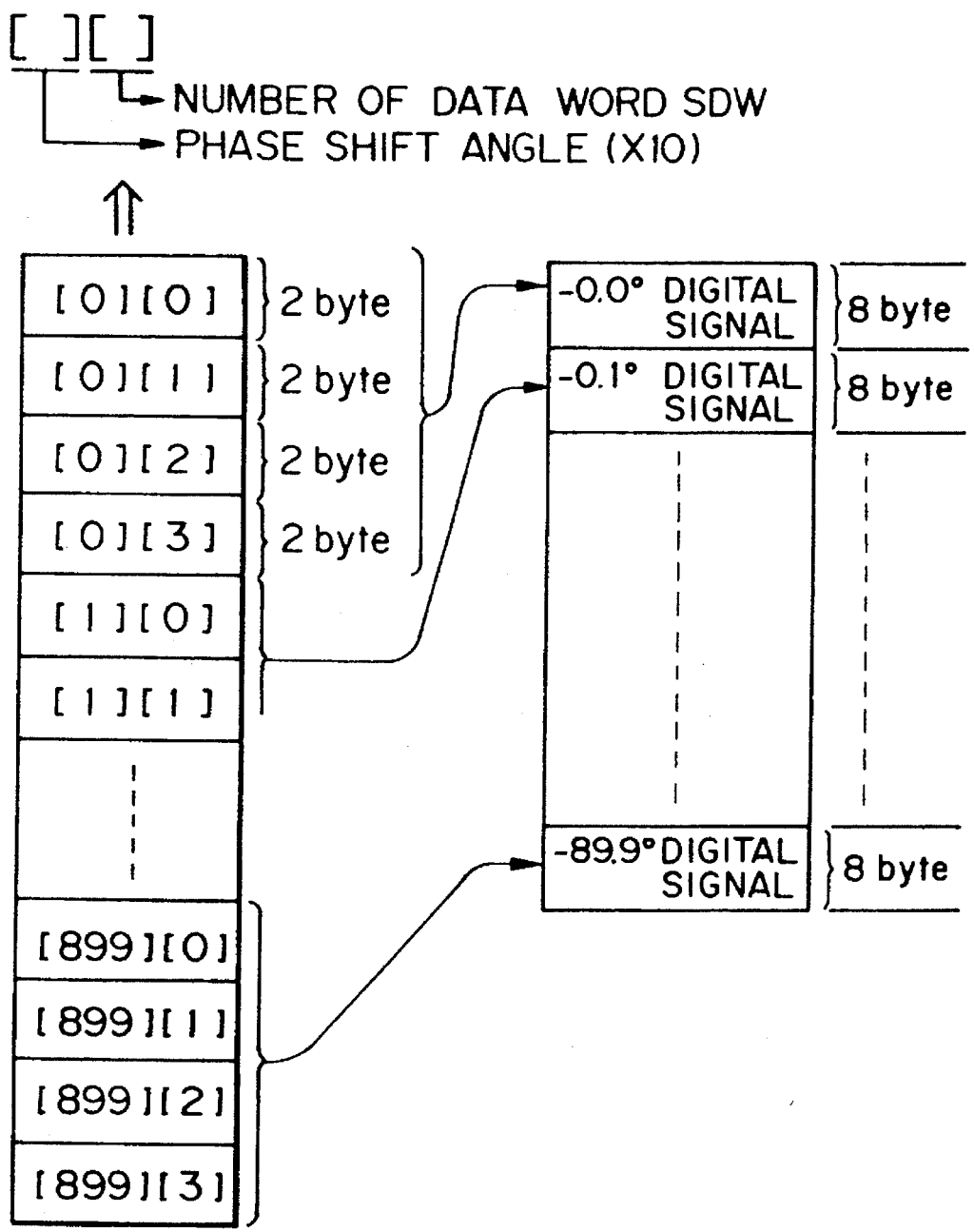
FIG. 5 is a diagram showing a mapping for digital phase-shifted waveform signals stored as a look-up table in a memory within the digital phase shifter shown in FIG. 2.

Next, referring to FIGS. 5–7, how to write a digital phase-shifted waveform signal into the register will be explained. In FIG. 5, there is illustrated the locations in the memory 320 for digital phase-shifted waveform signals PHDs which have 900 different phase shifts over a span of 90 degrees with the resolution of 0.1 degrees, i.e., from −0.0 to −89.9 degrees. Each of the digital phase-shifted waveform signals having respective phase shifts consists of eight bytes, and each of stored data words SDW1–SDW4 constituting each digital phase-shifted waveform signal consists of two bytes. The 900 digital phase-shifted waveform signals are also used for the rest of the phase shift range over an entire span of 360 degrees. More specifically, they are used for forming digital phase-shifted waveform signals in each of ranges from −90.0 to −179.9 degrees; from −180.0 to −269.9 degrees; and from −270.0 to −359.9 degrees. Specifically explaining using data words $SDW1_{0.1}$–$SDW4_{0.1}$, for −0.1 degrees, data words of a digital signal with −90.1 degrees of phase shift are formed of ($SDW4_{0.1}$, $SDW1_{0.1}$, $SDW2_{0.1}$, $SDW3_{0.1}$), while data words of a digital signal with −180.1 degrees of phase shift are formed of ($SDW3_{0.1}$, $SDW4_{0.1}$, $SDW1_{0.1}$, $SDW2_{0.1}$); and data words of a digital signal with −270.1 degrees of phase shift are formed of ($SDW2_{0.1}$, $SDW3_{0.1}$, $SDW4_{0.1}$, $SDW1_{0.1}$).

Figure 6:
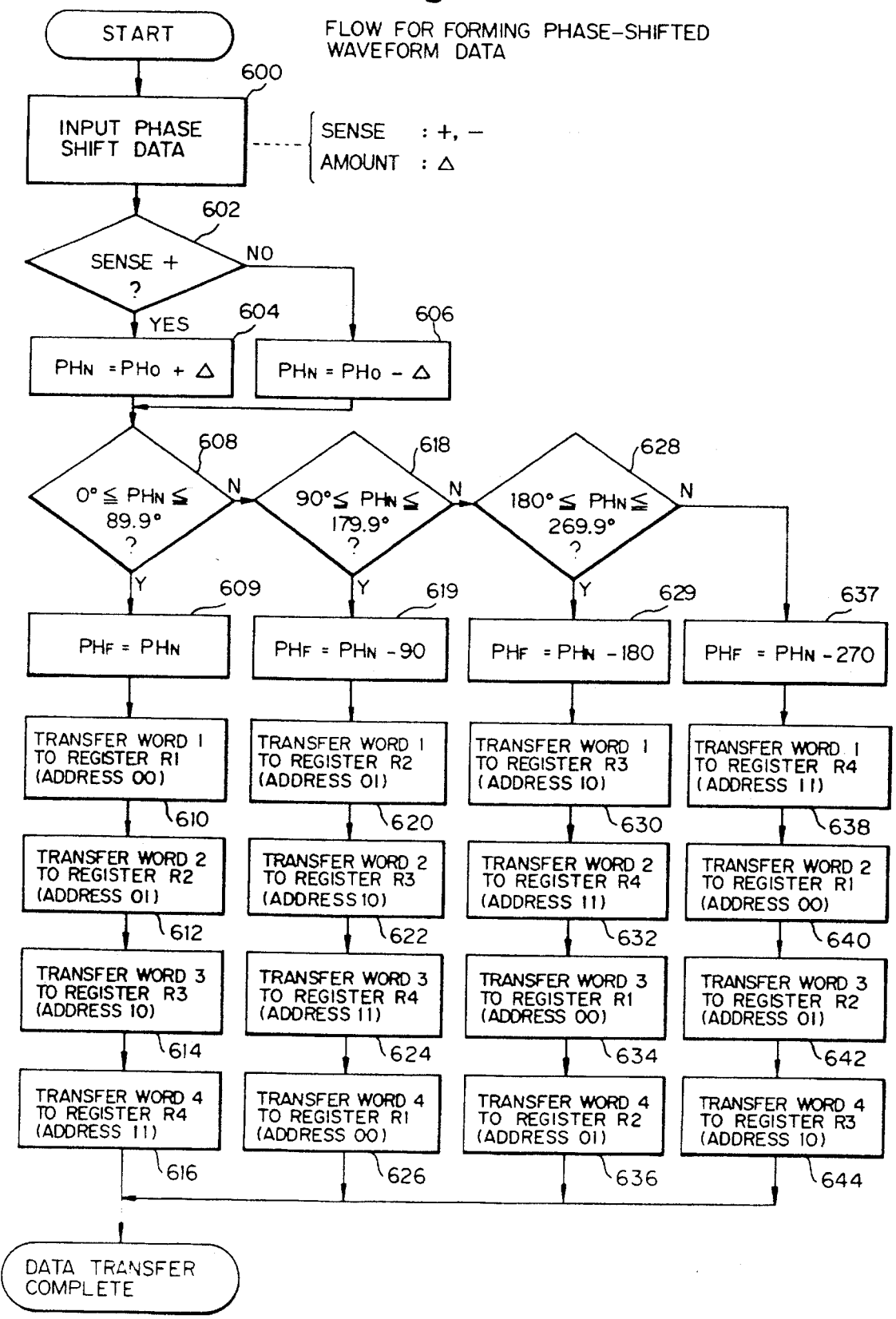
FIG. 6 is a flow chart showing the flow executed by a CPU in the digital phase shifter of FIG. 2 for forming phase-shifted waveform data.
Figure 7:
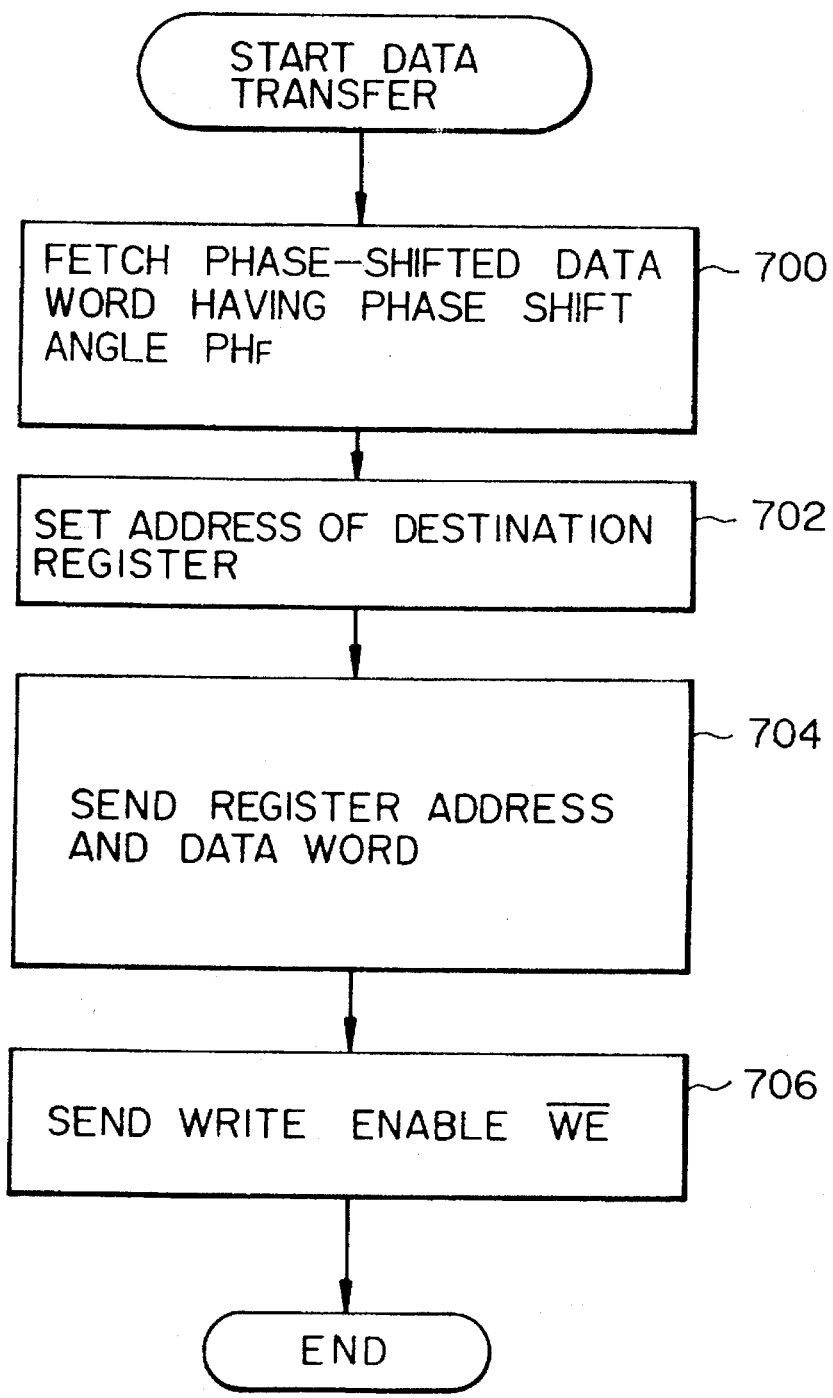
FIG. 7 is a flow chart showing a data transfer subroutine executed in the flow of FIG. 6.

FIG. 6 shows a phase-shifted waveform data forming flow executed by the CPU 300 for forming data for the span of 360 degrees from the data for the span of 90 degrees. At the first step 600 of the flow, a phase shift data input is received from the input section 200 which may be, for example, a rotary encoder. The input includes the sense (+ or −) and amount (Δ) of the phase shift change. At next step 602, decision is made to determine the sense, and the flow proceeds to step 604 when it is plus (+) and to step 606 when it is minus (−). At the steps 604 and 606, a new phase shift angle $PH_N$ is calculated from an old phase shift angle $PH_O$ and the amount A. Next, at step 608, when the new phase shift angle $PH_N$ is within a range from 0.0 degrees to 89.9 degrees, the flow proceeds to a sequence of steps 609–616. Also, the flow proceeds to steps 619–626 through step 618 when from 90.0 degrees to 179.9 degrees; to steps 629–636 from step 628 when from 180.0 degrees to 269.9 degrees; and to steps 637–644 when from 270.0 degrees to 359.9 degrees.

Explaining for $PH_N$ being within the range from 0.0 degree to 89.9 degrees, a phase shift angle $PH_F$ for fetching from the memory is made equal to $PH_N$ at step 609, and a data word SDW1 of a digital phase-shifted waveform signal for $PH_F$ is transferred to the register R1 at step 610. This transfer is executed by a data transfer subroutine shown in FIG. 7. More specifically, the first data word of the digital phase-shifted waveform signal having the phase shift angle $PH_F$ is fetched at step 700, and the address "00" of the destination register, i.e., the register R1 is set at step 702. Then, the register address and data word are sent to the terminals WA and WB and the terminals D1–D10, respectively, at step 704. Next, at step 706, a write enable signal $WE^-$ is sent to the terminal $WE^-$ of the register 340 such that the data word is written into the corresponding register R1.

Similarly, transfers are executed at steps 612, 614 and 616. As a result, generated data words GDW1–GDW4 in the registers R1–R4 are as follows: GDW1=SDW1; GDW2=SDW2; GDW3=SDW3; and GDW4=SDW4.

When YES at step 618, i.e., when from 90.0 degrees to 179.9 degrees, $PH_N$ minus 90 is defined as the fetching phase shift angle $PH_F$ at step 619, and similar processings as those at the aforementioned steps 610–616 are executed at steps 620–626. However, in the present case, the numbers of the destination registers to which data words are transferred are shifted by one. Therefore, generated data words GDW1–GDW4 in the registers R1–R4 are as follows: GDW1=SDW4; GDW2=SDW1; GDW3=SDW2; and GDW4=SDW3. Similarly, when YES at step 628, i.e., when from 180.0 degrees to 269.9 degrees, a calculation $PH_F = PH_N - 180$ is performed at step 628. The numbers of the destination registers are shifted further by one, such that generated data words GDW1–GDW4 in the registers R1–R4 are as follows: GDW1=SDW3; GDW2=SDW4; GDW3=SDW1; and GDW4=SDW2. When No at step 628, i.e., when from 270.0 degrees to 359.9 degrees, a calculation $PH_F = PH_N - 270$ is performed at step 637. Since the numbers of the destination registers are shifted further by one, generated data words GDW1–GDW4 in the registers R1–R4 are as follows: GDW1=SDW2; GDW2=SDW3; GDW3=SDW4; and GDW4=SDW1. In the foregoing manner, the registers R1–R4 store data words constituting a digital phase-shifted waveform signal having a specified phase shift angle. Thus, phase shift data over the span of 360 degrees can be formed from the phase shift data over the span of 90 degrees.

The stored data words continue to be held in the registers as long as new phase shift data are not inputted. If new phase shift data are inputted, the above described processing is performed with the current phase shift angle $PH_N$ being treated as an old phase shift angle $PH_O$. The read-out, conversion, and smoothing for data words stored in the registers are performed as described above.

Next, referring to FIGS. 8(A) and 8(B), bit manipulations to data words of phase-shifted waveforms for improving the phase resolution will be explained. FIG. 8(A) shows groups of data words of digital waveform signals having four adjacent phase shift angles near each of −29 degrees and −70 degrees. In the present embodiment, since phase shift data in the phase resolution of 0.1 degrees have been created by the use of a D/A convertor having a resolution of 10 bits and 10-bits data word representations, the groups of data words for −29.4 degrees and −29.5 degrees are identical to each other, and the groups of data words for −70.2 and −70.3 degrees are also identical to each other, as illustrated.

In the present embodiment, for providing different digital signals for all phase shift angles without increasing the resolution of the D/A convertor and the number of bits of the data word, groups of data words resultingly the same as others are subjected to bit manipulations. In the present embodiment, the bit manipulations are carried out in accordance with the following rules by way of example (It should be noted that the bit manipulations can be carried out in other ways.):

1) As a group of data words to be modified, one of the groups of data words having adjacent phase shift angles which has a smaller phase shift angle is selected.

2) As a data word to be modified, data word 1 is selected in the range of −0.0 degrees to −44.9 degrees, and data word 2 in the range of −45.0 degrees to −89.9 degrees.

3) As an amount of modification, an increase by one is used in the range of −0.0 degrees to −44.9 degrees and a decrease by one in the range of −45.0 degrees to −89.9 degrees.

FIG. 8(B) shows groups of data words after they have undergone the bit manipulations in accordance with the above rules (modified portions are underlined). For a digital phase-shifted waveform signal having a phase shift angle of −29.4 degrees, the data word SDW1 is incremented by one such that 289H is changed to 28AH. Note that, even if this modification is made, it still has a different data word SDW3 from that of a digital phase-shifted waveform signal having a phase shift angle of −29.3 degrees. Also, for the digital phase-shifted waveform signal for −70.2 degrees, the data word SDW3 is decremented by one such that 2DAH is changed to 2D9H. Again, it is not identical to a digital phase-shifted waveform signal for −70.1 degrees, and a phase shift angle of the entire waveform is larger than that of the digital signal with −70.1 degrees. By the bit manipulations, the eventual phase-shifted waveforms will be distorted to have slightly advanced phases. As a result, a resolution closer to the phase resolution of 0.1 degrees can be realized.

While the embodiment of the present invention has been described, the following modifications may be made. First, while in the foregoing embodiment, digital phase-shifted waveform signals over a span of 90 degrees are prepared, digital phase-shifted waveform signals may be prepared over a span of more or less than 90 degrees, or for the entire range of phase shifts. Secondly, while N=4 is assumed in the foregoing embodiment, any other value may be selected. Then, the numbers of decoders and registers, the number of words in a data word group, and so on may be modified. Thirdly, while the inputted waveform is a sinusoidal wave in the foregoing embodiment, the phase shift may be performed on any other periodic waveform.

According to the present invention as described above, waveforms having different phase shifts are held as individual digital signals, so that each phase-shifted waveform can be generated with a simple configuration. Also, since one period is represented by N data words, a higher phase resolution can be provided when a D/A convertor having a fixed resolution is used.

What is claimed is:

1. A digital phase shifter for generating a phase-shifted waveform shifted in phase by a specified phase shift from an input waveform having a predetermined frequency, comprising:

(a) a PLL circuit including an input terminal for receiving said input waveform in an analog form and a voltage controlled oscillator for generating an oscillation signal, said oscillation signal being phase-locked to said input waveform and having a frequency N times said predetermined frequency, where N is an integer equal to or larger than two;

(b) phase shift specifying means for generating a phase shift specifying signal representing a specified phase shift;

(c) digital phase-shifted waveform signal generator means connected to receive said oscillation signal and said phase shift specifying signal and having a plurality of digital phase-shifted waveform signals stored therein, said plurality of digital phase-shifted waveform signals having different phase shifts, said generator means being operative to generate a digital phase-shifted waveform signal having said specified phase shift from said plurality of stored digital phase-shifted waveform signals; and (d) convertor means connected to receive said generated digital phase-shifted waveform signal for converting said generated digital phase-shifted waveform signal to an analog form to generate said phase-shifted waveform.

2. A digital phase shifter according to claim 1, wherein each of said plurality of digital phase-shifted waveform signals is constituted of an N number of waveform data words.

3. A digital phase shifter according to claim 2, wherein said plurality of stored digital phase-shifted waveform signals are signals corresponding to a partial range within an entire range of phase shifts.

4. A digital phase shifter according to claim 3, wherein said entire range of phase shifts is an angular range for a period of said input waveform.

5. A digital phase shifter according to claim 4, wherein said digital phase-shifted waveform signal generator means comprises:

(a) storage means for storing a plurality of digital phase-shifted waveform signals in a phase shift range from zero to 1/N of said entire range of phase shifts, each stored digital phase-shifted waveform signal including a period portion of a waveform being constituted of an N number of waveform data words, said N number of waveform data words including from a first waveform data word associated with a first 1/N period portion to a Nth waveform data word associated with an Nth 1/N period portion;

(b) determining means for determining which of an N number of 1/N ranges within said entire range of phase shifts from a range 0–1/N to a range (N−1)/N—N/N, said specified phase shift falls under;

(c) an N number of register means including first to Nth registers for holding an N number of 1/N period portions of generated phase-shifted waveform data words from a first 1/N period portion to a Nth 1/N period portion;

(d) writing means for distributively writing said first to Nth waveform data words of one stored digital phase-shifted waveform signal within said plurality of stored digital phase-shifted waveform signals into said first to Nth registers in accordance with one of different distributing ways depending on a determination result of said determining means, so as to constitute a digital phase-shifted waveform signal having said specified phase shift by the waveform data words held in said first to Nth registers; and (e) reading means connected to receive said oscillation signal for reading and outputting the contents of said first to Nth registers during the first to Nth 1/N period portions, respectively, of said input waveform.

6. A digital phase shifter according to claim 5, wherein:

(a) said convertor means comprises a D/A convertor for converting a digital signal having a predetermined number of bits to an analog signal; and (b) each said waveform data word includes said predetermined number of bits.

7. A digital phase shifter according to claim 6, wherein within said plurality of stored digital phase-shifted waveform signals, if said N number of waveform data words of respective stored digital phase-shifted waveform signals corresponding to adjacent phase shifts are identical to each other, at least one waveform data word in said N number of waveform data words of one of said stored digital phase-shifted waveform signals is modified to make said plurality of stored digital phase-shifted waveform signals different from each other.

8. A digital phase shifter according to any of claims 1–7, wherein said input waveform is a sinusoidal wave.

9. A digital phase shifter according to any of claims 1–7, wherein said input waveform is a subcarrier of a television signal.

10. A digital phase shifter according to any of claims 1–7, wherein said N is equal to four.

11. A phase shifting method for generating a phase-shifted waveform shifted in phase by a specified phase shift from an input waveform having a predetermined frequency, comprising the steps of:

(a) receiving said input waveform in an analog form and generating an oscillation signal being phase-locked to said input waveform and having a frequency N times said predetermined frequency, where N is an integer equal to or larger than two;

(b) generating a phase shift specifying signal representing a specified phase shift;

(c) generating a digital phase-shifted waveform signal having said specified phase shift from a plurality of predetermined digital phase-shifted waveform signals having different phase shifts; and (d) converting said generated digital phase-shifted waveform signal to an analog form in synchronism with said oscillation signal to generate said phase-shifted waveform.

12. A phase shifting method according to claim 11, wherein each of said plurality of digital phase-shifted waveform signals is constituted of an N number of waveform data words.

13. A phase shifting method according to claim 12, wherein said plurality of digital phase-shifted waveform signals are signals corresponding to a partial range within an entire range of phase shifts.

14. A phase shifting method according to claim 13, wherein said entire range of phase shifts is an angular range for a period of said input waveform.

15. A phase shifting method according to claim 14, wherein said step of generating a digital phase-shifted waveform signal comprises the steps of:

(a) preparing a plurality of digital phase-shifted waveform signals in a phase shift range from zero to 1/N of said entire range of phase shifts, each said digital phase-shifted waveform signal including a period portion of a waveform being constituted of an N number of waveform data words, said N number of waveform data words including from a first waveform data word associated with a first 1/N period portion to an Nth waveform data word associated with an Nth 1/N period portion;

(b) determining which of an N number of 1/N ranges within said entire range of phase shifts from a range 0–1/N to a range (N–1)/N–N/N, said specified phase shift falls under;

(c) writing said first to Nth waveform data words of one digital phase-shifted waveform signal within said plurality of digital phase-shifted waveform signals into an N number of first to Nth registers for holding a first 1/N period portion to an Nth 1/N period portion of a generated phase-shifted waveform data word in accordance with one of different distributing ways depending on a determination result, so as to constitute a digital phase-shifted waveform signal having said specified phase shift by the waveform data words held in said first to Nth registers; and (d) receiving said oscillation signal and reading out the contents of said first to Nth registers during the first to Nth 1/N period portions, respectively, of said input waveform.

* * * * *